United States Patent [19]
Nakagawa

[11] Patent Number: 5,892,727
[45] Date of Patent: Apr. 6, 1999

[54] WORD LINE DRIVER IN A MULTI-VALUE MASK ROM

[75] Inventor: Yukiharu Nakagawa, Kanagawa, Japan

[73] Assignee: NEC Corporation, Tokyo, Japan

[21] Appl. No.: 936,732

[22] Filed: Sep. 25, 1997

[30] Foreign Application Priority Data

Sep. 27, 1996 [JP] Japan .................................. 8-256436

[51] Int. Cl.⁶ .................................................. G11C 8/00
[52] U.S. Cl. .................. 365/230.06; 365/168; 365/203; 365/194
[58] Field of Search ............................. 365/230.06, 168, 365/203, 194

[56] References Cited

U.S. PATENT DOCUMENTS

| | | | |
|---|---|---|---|
| 4,809,224 | 2/1989 | Suzuki et al. ............................. | 365/94 |
| 4,985,865 | 1/1991 | Houston ................................... | 365/194 |
| 5,457,650 | 10/1995 | Sugiura et al. .......................... | 365/184 |
| 5,610,872 | 3/1997 | Toda ................................... | 365/230.06 |
| 5,680,343 | 10/1997 | Kamaya ................................... | 365/104 |

*Primary Examiner*—David Nelms
*Assistant Examiner*—Vanthu Nguyen
*Attorney, Agent, or Firm*—Foley & Lardner

[57] ABSTRACT

A method for driving a word line in a multi-value mask ROM comprises the consecutive steps of precharging the word line by a source potential, setting the word line at a first potential which is lower than the source potential and reading data from a selected memory cell, precharging the word line by the source potential, charging the word line at the second potential which is lower than the source potential and reading data from the selected memory cell, setting the word line at the source potential and reading data from the selected memory cell. The precharge of the word line reduces the read time for the multi-value mask ROM.

8 Claims, 4 Drawing Sheets

5,892,727

WORD LINE DRIVER IN A MULTI-VALUE MASK ROM

BACKGROUND OF THE INVENTION (a) Field of the Invention

The present invention generally relates to a word line river for use in a multi-value mask read-only memory device (ROM), and to a method for reading data from a multi-value mask ROM.

(b) Description of the Related Art

Multi-value mask ROM is generally used for storing a large capacity program data etc. in a reduced chip area. FIG. 1 shows a block diagram of a conventional word line driver in a multi-value mask ROM, whereas FIGS. 2A and 2B are a timing chart and a waveform chart, respectively, of the signals in the word line driver of FIG. 1. The word line driver shown in FIG. 1 comprises a word line potential generator 11 for providing a plurality of potential levels, a timing signal generator 25 for detecting an address change in an address signal to thereby generate a plurality of one-shot signals at different timings, and a word line decoder 13 for decoding the address signal to select one of the word lines specified by the address signal. The timing signal generator 25 includes a delay circuit 26 for receiving an original one-shot signal to generate one-shot pulses at different timings. The output of the word line decoder 13 is connected to a word line 14, which is connected to the gates of memory cells 50 arranged in a selected row of a memory unit 51. The word line 14 is connected to the output of the word line decoder 13 and includes a parasitic resistance of several hundred kilo-ohms and a parasitic capacitance of several pico-farads, as shown in FIG. 1.

In the multi-value mask ROM, the different potential levels are provided for read-out of data from a selected memory cell, the different potential levels corresponding to the multi-value data stored in the memory cells. The multi-value data have been written into each memory cell by supplying different levels of writing voltage based on the multi-value data to be stored. The thus stored multi-value data can be read-out by specifying the respective voltage levels with which the data have been written.

Here, an example is given in the figures for reading two-bit data as the multi-value data. In this example, one of a possible set of multi-value data (0, 0), (0, 1), (1, 0) and (1, 1) is stored in the selected memory cell, the multi-value data corresponding to respective writing voltage levels 0, 1, 2 and 3. The relationship between the potential levels generated by the word line potential generator 11 is such that (source potential)>(second potential)
>(first potential), wherein the voltage level 0 for writing is set lower than the first potential, the voltage level 1 is set between the first potential and the second potential, the voltage level 2 is set between the second potential and the power source potential, and the voltage level 3 is set higher than the source potential.

In operation, the timing signal generator 25 receives an address signal 100 supplied from outside the ROM, and outputs an original one-shot pulse 101 by responding to the address change in the address signal 100, as shown in FIG. 2A. The delay circuit 26, receiving the original one-shot pulse 101, outputs a first one-shot pulse 102 at the first tap after a first fixed delay, thereby supplying the first potential from the word line potential generator 11 to the source of the P-channel transistor of an inverter 21 in the word line decoder 13. As a result, the potential of the word line 14 rises from the ground potential to the first potential. Here, a time difference arises before desired potential values are attained between the proximal end (106) and the distal end (107) of the word line 14 with respect to the output of the word line decoder 13, as shown in FIG. 2B. The writing voltage applied for the selected memory cell in the fabrication process of the ROM is determined by discriminating the voltage read out from the selected memory cell between the level 0 and a level other than 0. If the writing voltage is determined to be zero, then the stored data is (0,0).

A second one-shot pulse 103 is then generated by the delay circuit 15 at the second tap after a second fixed delay, thereby supplying the second potential from the word line potential generator 11 to the source of the P-channel transistor of the inverter 21. As a result, the electric potential of the word line 14 rises from the first potential to the second potential. The writing voltage for the selected memory cell is determined by discriminating the read out voltage between the level 1 and a level other than 1, if the selected voltage has been determined as a level other than 0 during application of the first potential to the word line. If the writing voltage is determined to be level 1, then the stored data is (0,1).

Further, a third one-shot pulse 104 is generated by the delay circuit 26 at the third tap after a third fixed delay, thereby supplying the power source potential from the word line potential generator 11 to the source of the P-channel transistor of the inverter 11. As a result, the electric potential of the word line 14 rises from the second potential to the source potential. The writing voltage for the selected memory cell is then determined by discriminating the voltage read out from the selected memory cell either the level 2 or a level other than 2, if the writing voltage has been determined as a level other than 0 for the first potential and a level other than 1 for the second potential. This provides the discrimination of the stored data between (1,0) and (1,1). With these operations, it is possible to determine the writing voltage level for the selected memory cell, which is specified by the word line decoder 13 and a column decoder not shown, to read out the written multi-value data.

After the read-out, a discharge one-shot pulse 105 is supplied from the delay circuit 15 at the fourth tap, and turns on the N-channel transistor 20, thereby lowering the electric potential of the word line 14 to the ground potential to prepare for a next read cycle which starts by responding to a next address change.

In the conventional word line driver as described above, in order to attain a higher speed in setting the electric potential of the distal end of the word line to a desired level, enlargement of the dimensions of the word line decoder, lessening of the length of the word line per one word line decoder or other measures is needed because of the difference in the transmission time between the proximal end and the distal end of the word line due to the parasitic resistance and capacitance involved in the word line. The enlargement of the dimensions etc., however, necessitates a large chip area or other problem in the mask ROM.

SUMMARY OF THE INVENTION

In view of the above, it is an object of the present invention to provide a word line driver for driving a word line in a multi-value mask ROM, which is capable of setting the electric potential of the word line at a higher speed, with a limited enlargement of the ROM area.

It is another object of the present invention to provide a method for reading data from a memory cell in a multi-value mask ROM.

The present invention provides a word line driver for driving a word line in a multi-value mask ROM having a plurality of memory cells each storing therein multi-value data. The word line driver comprises a potential generator for generating a plurality of charge potentials and a precharge potential which is higher than at least one of the charge potentials, a first signal generator for generating an original signal at a start of a read cycle by responding to an address change in an address signal, a second signal generator for receiving the original signal to output in the read cycle at least one precharge signal and a plurality of one-shot pulses having different delays from the original signal and each corresponding to one of the charge potentials, and a potential supply section for supplying the plurality of charge potentials to the word line by responding to respective the one-shot pulses, the potential supply section supplying the precharge potential to the word line by responding to the precharge signal before supplying the charge potentials to the word line in the read cycle.

The present invention also provides a method for operating a multi-value mask ROM having a plurality of memory cells each storing therein multi-value data. The method comprises in a single read cycle the consecutive steps of supplying a first precharge potential to a word line, supplying a first charge potential to the line, the first precharge potential being higher than the first charge potential, reading data from a selected memory cell during supplying the first charge potential, supplying a second charge potential to the word line, the second charge potential being higher than the first charge potential, and reading data from the selected memory cell during supplying the second charge potential.

In accordance with the present invention, it is possible to set the word line at a desired potential level at a high speed by the precharge of the word line by a higher potential level before setting the desired potential level.

The above and other objects, features and advantages of the present invention will be more apparent from the following description, referring to the accompanying drawings.

DESCRIPTION OF THE PREFERRED EMBODIMENT

Figure 1:
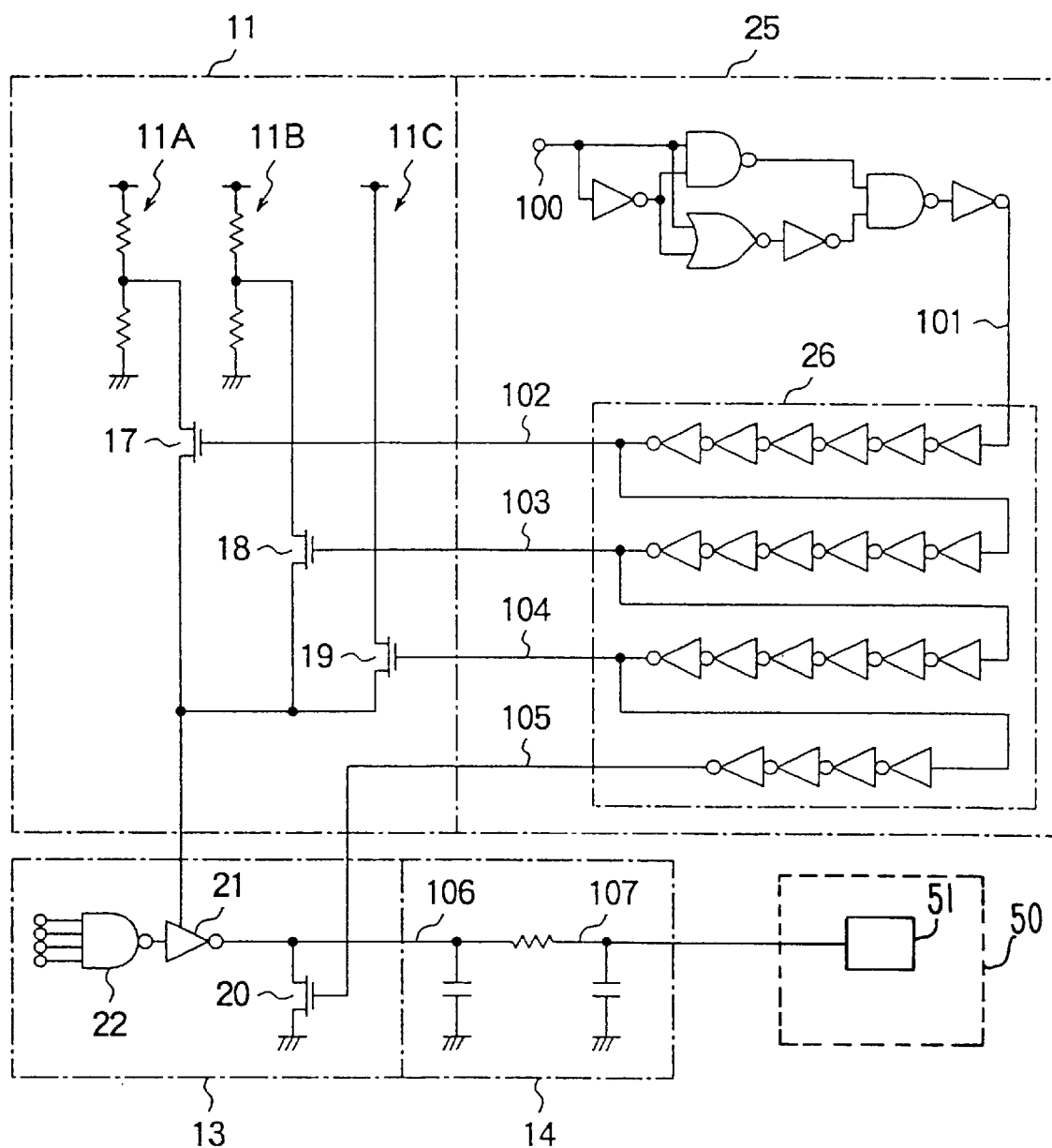
FIG. 1 is a block diagram of a conventional word line driver for driving a word line in a multi-value mask ROM.
Figure 2A:
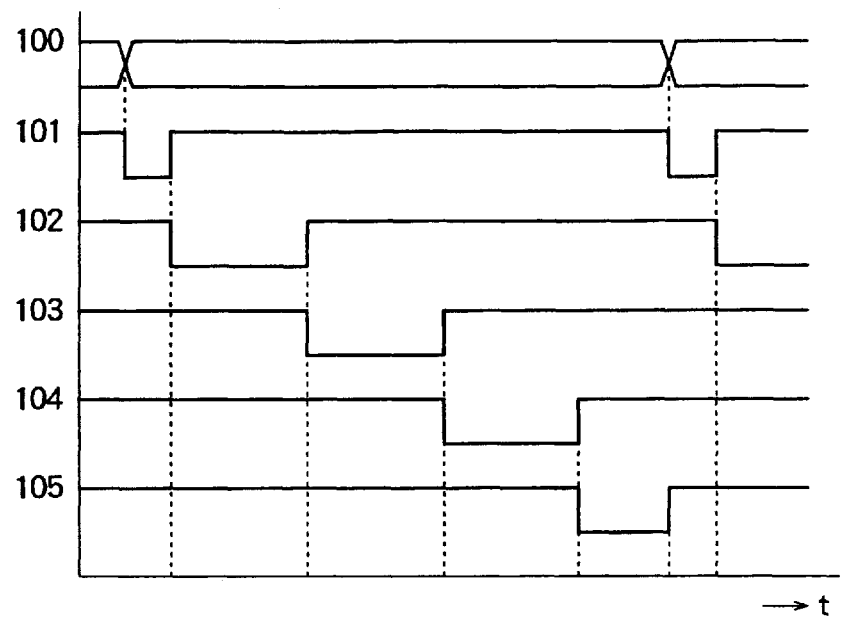
FIGS. 2A and 2B are a timing chart and a wave-form chart, respectively, of the signals generated in the conventional word line driver of FIG. 1.
Figure 2B:
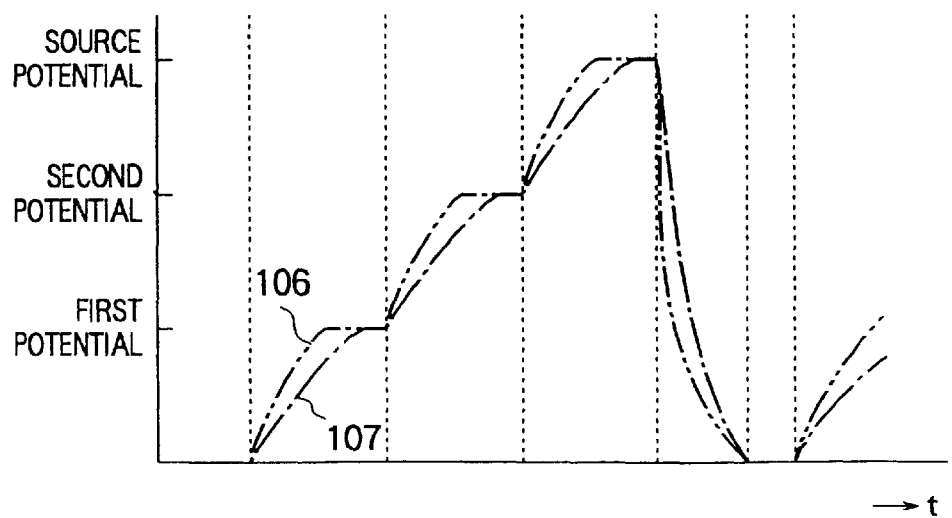

Now, the present invention is more specifically described with reference to accompanying drawings, wherein similar elements are designated by the same or similar reference numerals throughout the drawings.

In the following description, an exemplary embodiment will be described wherein two-bit data is stored in the memory cells as the multi-value data.

Figure 3:
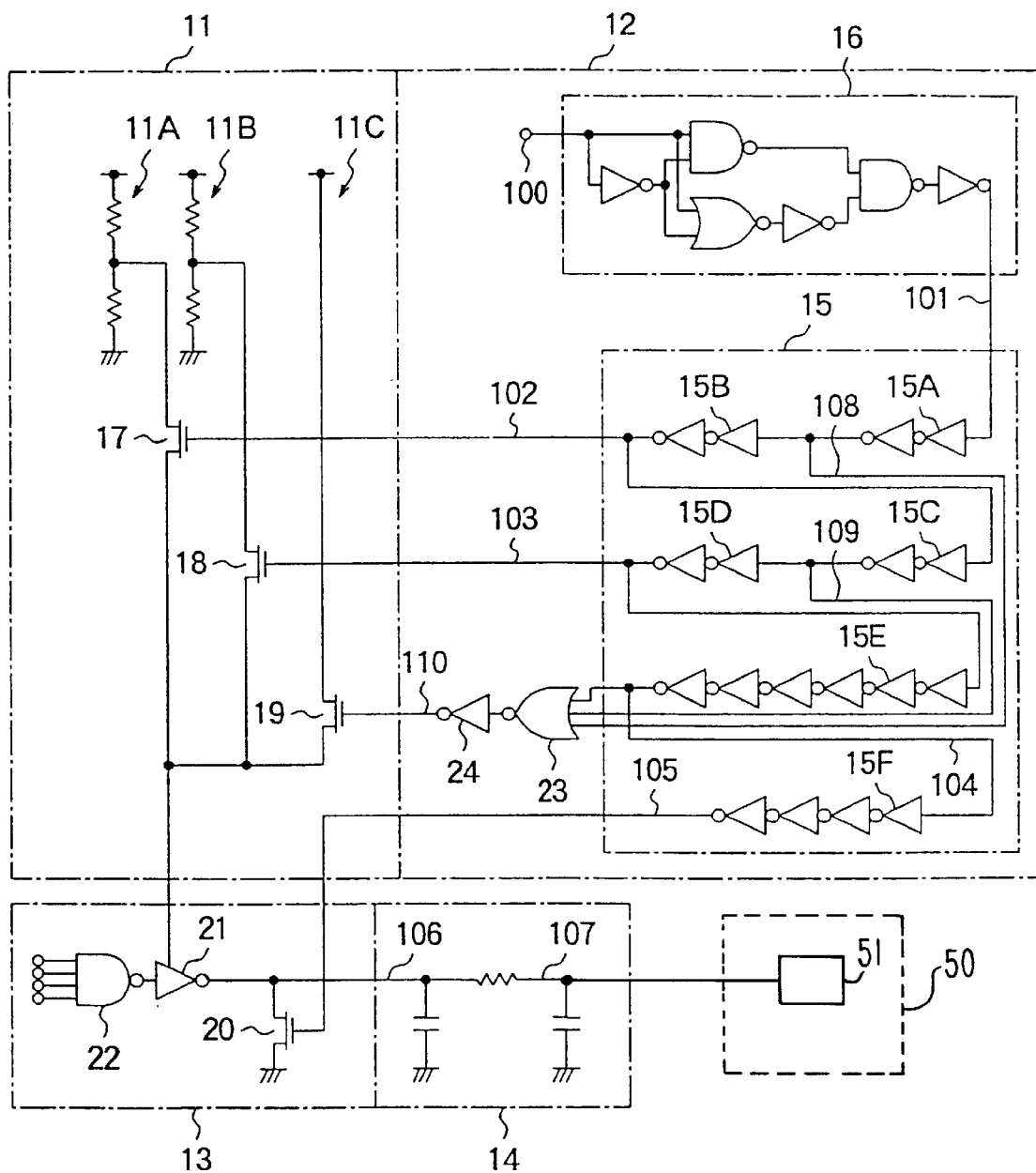
FIG. 3 is a block diagram of a word line driver for driving a word line in a multi-value mask ROM according to an embodiment of the present invention.

Referring to FIG. 3, a word line driver for driving a word line in a multi-value mask ROM according to an embodiment of the present invention comprises a word line potential generator 11, a timing signal generator 12 including a delay circuit 15, and a word line decoder 13. The output of the word line decoder 13 is connected to a word line 14 for driving gates of the memory cells 51 arranged in a row of a memory unit 51. The word line 14 involves a large parasitic resistance of, for example, several hundred kilo-ohms and a large parasitic capacitance of, for example, several picofarads. The present embodiment is similar to the conventional word driver of FIG. 1 except for the structure of the timing signal generator 12 including the structure of the delay circuit 15.

The word line potential generator 11 comprises a first potential generator section 11A for generating a first potential by using divisional resistors, a second potential generator section 11B for generating a second potential higher than the first potential also by using divisional resistors, and a source potential delivering section 11C for delivering a source potential which is higher than the second potential. The first, second and source potentials are delivered by first through third transistors 17, 18 and 19 provided in the word line potential generator 11.

The timing signal generator 12 comprises a one-shot pulse generating section 16 for receiving an address signal 100 to generate an original one-shot pulse 101 by responding to the address change occurring in the address signal 100, and a delay circuit 15 for receiving the original one-shot pulse 101 to generate first and second one-shot pulses 102 and for driving the first and second transistors 17 and 18, respectively, in the word line potential generator, first through third auxiliary delay pulses 108, 109 and 104, and a discharge signal 105. The timing signal generator 12 further comprises a NOR gate 23 receiving the first through third auxiliary delay pulses 108, 109 and 104 and an inverter 24 for receiving an output from the NOR gate 23 to generate a combinational signal 110 for driving the third transistor 19 in the word line potential generator 11. The one-shot pulse generating section 16 comprises a set of logic gates, the structure of which is well-known in the art, and accordingly, detailed description thereof is omitted herein.

The delay circuit 15 in the timing signal generator 12 comprises first through sixth delay sections 15A to 15F each implemented by a plurality of inverters, each of which acts as a unit delay element. The delay times of the first through fourth delay sections 15A to 15D are equal to one other, and the delay times of the fifth delay section 15E and the sixth delay section 15F are triple and double, respectively, those of the first through fourth delay sections 15A to 15D. The delays of the first through fourth delay sections 15A to 15D correspond to the pulse duration of the original one-shot pulse 101.

The first delay section 15A receives the original one-shot pulse to output the first auxiliary delay pulse 108, and the second delay section 15B receives the first auxiliary delay pulse 108 to provide the first one-shot pulse 102. The third delay section 15C receives the first one-shot pulse from the second delay section 15B to output the second auxiliary delay pulse 109, and the fourth delay section 15D receives the second auxiliary delay pulse 109 to output the second one-shot pulse 103. The fifth delay section 15E receives the second one-shot pulse from the fourth delay section 15D to output the third auxiliary delay pulse 104, and the sixth delay section 15F receives the third auxiliary delay pulse 104 to output the discharge signal 105, which is delivered to the ground transistor 20 for grounding the word line 14.

By the configurations as described above, the timing signal generator 12 generates a precharge pulse in the combinational signal 110 at a timing just before each of the first and second one-shot pulses 102 and 103 is generated, additionally to the third one-shot pulse for maintaining the word line at the power source potential.

In the multi-value mask ROM of FIG. 3, a plurality of threshold voltages are provided during the fabrication process, by supplying different levels of the writing voltage based on the multi-value data to be stored. The stored multi-value data can be read-out by supplying a plurality of potential levels to the word line corresponding to the writing voltages with which the multi-value data have been written.

A possible set of two-bit data includes (0, 0), (0, 1), (1, 0) and (1, 1), which correspond to respective voltage levels 0, 1, 2 and 3 for writing the data into the memory cell. The relationship between the electric potentials generated by the word line potential generator 11 is such that:

(power source potential)>(second potential)
>(first potential).

The writing voltage level 0 is set lower than the first potential, the writing voltage level 1 is set between the first potential and the second potential, the writing voltage level 2 is set between the second potential and the power source potential, and the writing voltage level 3 is set higher than the power source potential.

Figure 4A:
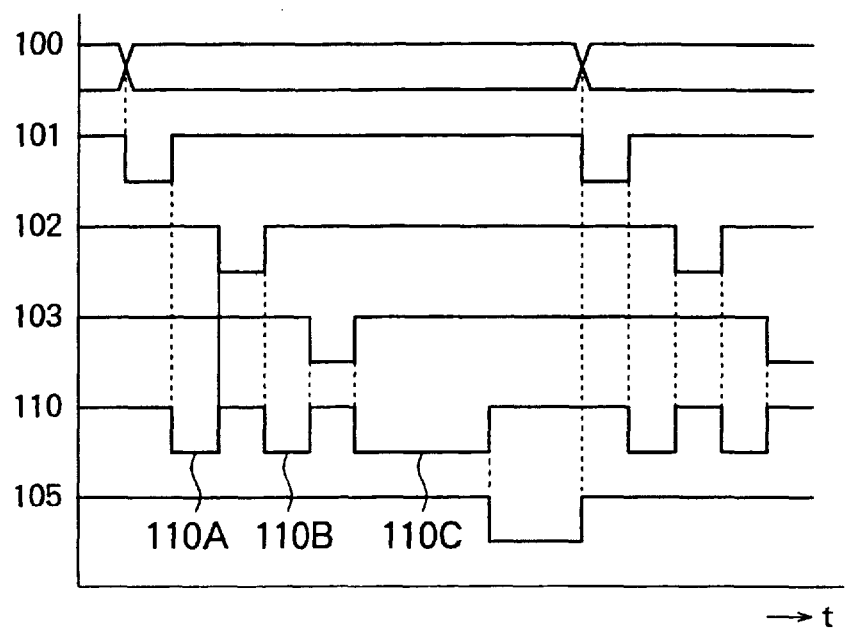
FIGS. 4A and 4B are a timing chart and a wave-form chart, respectively, of the signals generated in the word line driver of FIG. 3.

Referring additionally to FIG. 4A, at the start of a read cycle of the mask ROM of the present embodiment, the timing signal generator 12, receiving an address signal 100 supplied from outside the mask ROM, outputs an original one-shot pulse 101 by responding to an address change in the address signal 100. It is to be noted that the pulses described above and hereinafter are negative in polarity, as shown in FIG. 4A.

Figure 4B:
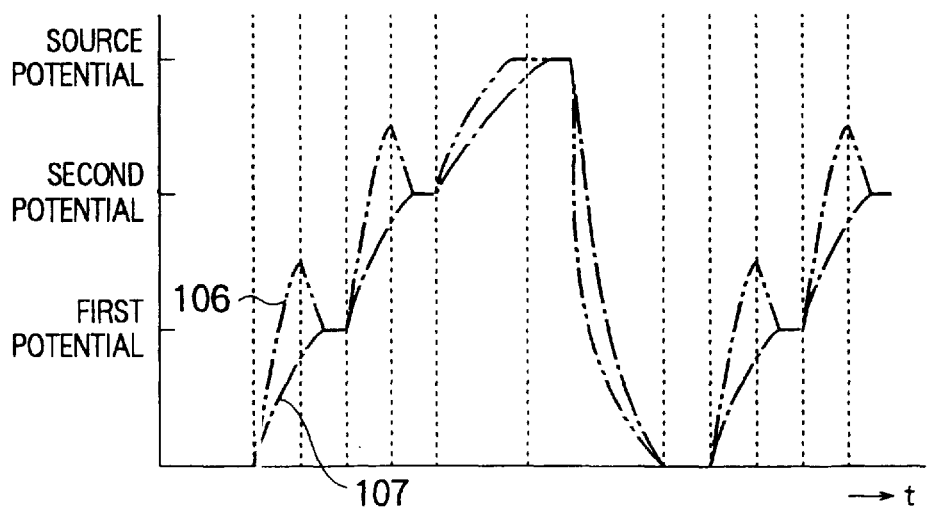

The delay circuit 15, upon receiving the original one-shot pulse 101, first generates a first auxiliary delay pulse 108, which in turn generates a precharge pulse 110A in the combinational pulse 110, at the end of the original one-shot pulse 101. Accordingly, the power source potential is supplied from the word line potential generator 11 to the source of the P-channel transistor of the inverter 21 in the word line decoder 13. As a result, the potential of the word line 14 of the proximal end 106 rapidly rises toward the power source potential during the pulse duration of the precharge pulse, as shown in FIG. 4B, slightly exceeding the first potential. The potential of the distal end 107 of the word line 14 also rises following the potential of the proximal end 106 toward the first potential.

A first one-shot pulse 102 is then generated at the end of the precharge pulse 110A, supplying the first potential level from the word line potential generator 11 to the source of the P-channel transistor of the inverter 21. As a result, the potential of the word line 14 is set at the first potential, lowering the potential of the proximal end 106 and raising the potential of the distal end 107. The writing voltage for the selected memory cell is then determined as (0,0) or other than (0,0) by discriminating the read-out voltage from the selected memory cell between 0 and other than 0.

A second auxiliary delay pulse 109, which generates a precharge pulse 110B in the combinational pulse 110, is then generated at the end of the first one-shot pulse 102, thereby supplying the power source potential from the word line potential generator 11 to the source of the P-channel transistor of the inverter 21. As a result, the potential of the word line 14 rapidly rises toward the power source potential, with the proximal end 107 of the word line exceeding the second potential.

A second one-shot pulse signal 103 is then generated at the end of the precharge pulse 110B, thereby setting the word line 104 at the second potential. The writing voltage for the selected memory cell can be determined as (0,1) or other than (0,1) by discriminating the read-out voltage from the selected memory cell between the level 1 and a level other than 1, provided that the writing voltage has been determined as other than (0,0) during the previous step.

A third one-shot pulse 110C is then generated in the combinational pulse 110 at the end of the second one-shot pulse 103, supplying the power source potential from the word line potential generator 11 to the source of the P-channel transistor of the inverter 21. As a result, the potential of the word line 14 rises from the second potential up to the power source potential. The writing voltage for the memory cell is determined as (1,0) or (1,1) by distinguishing the read-out voltage between the level 2 and a level other than 2, provided that writing voltage has been distinguished as a level other than 0 for the first potential and as a level other than 1 for the second potential.

Finally, a discharge pulse 105 is generated at the end of the third one-shot pulse 110C to turn on the N-channel transistor 20, thereby discharging the word line 14 to end the read cycle and to prepare a next read cycle.

In a modified embodiment, the second potential may be used as the precharge potential instead of the power source potential. In another modification, a third potential higher than the source potential may be used for the precharge potential.

Since the above embodiment is described only for an example, the present invention is not limited to the above embodiment and various modifications or alterations can be easily made therefrom by those skilled in the art without departing from the scope of the present invention.

What is claimed is:

1. A word line driver for driving a word line in a multi-value mask ROM having a plurality of memory cells each storing therein multivalue data, said word line driver comprising:

a potential generator for generating a plurality of charge potentials and a precharge potential which is higher than at least one of said charge potentials, a first signal generator for generating an original signal at a start of a read cycle by responding to an address change in an address signal, a second signal generator for receiving said original signal to output in the read cycle at least two precharge signals and a plurality of one-shot pulses having different delays from said original signal and each of the one-shot pulses corresponding to one of said charge potentials, and a potential supply section for supplying said plurality of charge potentials to the word line by responding to the respective ones of said one-shot pulses, said potential supply section supplying at least two precharge potential pulses to the word line, each of the at least two precharge potential pulses responsive to a corresponding one of said at least two precharge signals before supplying a corresponding one of said charge potentials to the word line in the read cycle.

2. A word line driver as defined in claim 1, wherein said precharge potential is equal to a highest one of said charge potentials.

3. A word line driver for driving a word line in a multi-value mask ROM having a plurality of memory cells each storing therein multivalue data, said word line driver comprising:

a potential generator for generating a plurality of charge potentials and a precharge potential which is higher than at least one of said charge potentials, a first signal generator for generating an original signal at a start of a read cycle by responding to an address change in an address signal, a second signal generator for receiving said original signal to output in the read cycle at least one precharge signal and a plurality of one-shot pulses having different delays from said original signal and each corresponding and each corresponding to one of said charge potentials, and a potential supply section for supplying said plurality of charge potentials to the word line by responding to the respective said one-shot pulses, said potential supply section supplying said precharge potential to the word line by responding to said precharge signal before supplying said charge potentials to the word line in the read cycle, wherein the difference between the delays of two of said one-shot pulses corresponds to a pulse duration of said one-shot pulse.

4. A word line driver as defined in claim 1 wherein said second signal generator further generates a discharge signal, and said potential supply section discharges the word line by responding to said discharge signal.

5. A word line driver for driving a word line in a multi-value mask ROM having a plurality of memory cells each storing therein multivalue data, said word line driver comprising:

a potential generator for generating a plurality of charge potentials and a precharge potential which is higher than at least one of said charge potentials, a first signal generator for generating an original signal at a start of a read cycle by responding to an address change in an address signal, a second signal generator for receiving said original signal to output in the read cycle at least one precharge signal and a plurality of one-shot pulses having different delays from said original signal and each corresponding and each corresponding to one of said charge potentials, and a potential supply section for supplying said plurality of charge potentials to the word line by responding to the respective said one-shot pulses, said potential supply section supplying said precharge potential to the word line by responding to said precharge signal before supplying said charge potentials to the word line in the read cycle, wherein said precharge potential is not lower than any of said charge potentials, and said supply section supplies said precharge potential before supplying each of said charge potentials in the read cycle.

6. A method for operating a multi-value mask ROM having a plurality of memory cells each storing therein multi-value data, said method comprising in a single read cycle the consecutive steps of supplying a first precharge potential to a word line, supplying a first charge potential to the line, said first precharge potential being higher than said first charge potential, reading data from a selected memory cell during supplying said first charge potential, supplying a second charge potential to the word line, said second charge potential being higher than said first charge potential, and reading data from the selected memory cell during supplying said second charge potential.

7. A method as defined in claim 6 further comprising the step of supplying a second precharge potential to the word line before supplying said second charge potential.

8. A method as defined in claim 6 further comprising the steps of supplying a third charge potential which is higher than said second charge potential, and reading data from the selected memory cell while supplying said third charge potential.

* * * * *